United States Patent
Magni et al.

(10) Patent No.: US 6,842,300 B2
(45) Date of Patent: Jan. 11, 2005

(54) OPTICAL DEVICE WITH OBJECTIVE SLIDABLE ENGAGED WITH SUPPORT STRUCTURE

(75) Inventors: Pierangelo Magni, Villasanta (IT); Francesco Sala, Merate (IT); Eric Christison, Edinburgh (GB); Andrea Giovanni Cigada, Brugherio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 3 days.

(21) Appl. No.: 10/171,453

(22) Filed: Jun. 13, 2002

(65) Prior Publication Data

US 2003/0107825 A1 Jun. 12, 2003

(30) Foreign Application Priority Data

Jun. 14, 2001 (EP) .............................................. 01830395

(51) Int. Cl.[7] ................................................ G02B 7/02
(52) U.S. Cl. ........................ 359/819; 359/811; 359/822
(58) Field of Search ........................ 250/239; 359/819, 359/820, 822, 811

(56) References Cited

U.S. PATENT DOCUMENTS

| | | | | |
|---|---|---|---|---|
| 5,191,481 A | * | 3/1993 | Takizawa et al. | 359/811 |
| 6,011,661 A | | 1/2000 | Weng | 359/819 |
| 6,590,720 B2 | * | 7/2003 | Oba | 359/819 |

FOREIGN PATENT DOCUMENTS

| | | |
|---|---|---|
| DE | 297 18 809 U1 | 1/1998 |
| EP | 0 990 934 A1 | 4/2000 |

* cited by examiner

*Primary Examiner*—Hung Xuan Dang
(74) *Attorney, Agent, or Firm*—Lisa K. Jorgenson; Robert Iannucci; Seed IP Law Group PLLC

(57) ABSTRACT

An image-detecting device including: a body housing a sensor; a first supporting element, rigidly coupled with the body and defining a seat; and an objective including at least one optical unit having an optical axis. The seat forms a guide portion engaging directly and slidably an alignment portion formed by said optical unit to keep the optical axis orthogonal to the sensor.

27 Claims, 3 Drawing Sheets

OPTICAL DEVICE WITH OBJECTIVE SLIDABLE ENGAGED WITH SUPPORT STRUCTURE

BACKGROUND OF THE INVENTION

1. Field of the Invention

The present invention relates to an optical device, in particular to an image detector.

2. Description of the Related Art

As is known, in today's electronic industry, the trend towards integrating different devices in a single multipurpose system is increasingly marked. For example, the mobile-telephone field is undergoing an extremely rapid evolution, and one of the most important developments envisages the integration of miniaturized videocameras in cellphones.

To this aim, it is necessary to design sensor units, which, on the one hand, have reduced overall dimensions and are simple and inexpensive to produce and, on the other hand, have optical characteristics such as do not impair the quality of the images that are detected.

For greater clarity, reference is made to FIG. 1, wherein an image-detecting device 1 is illustrated, which comprises a sensor 2, a supporting element 3, and an objective 4.

The sensor 2, for example a matrix CMOS sensor, is formed in a semiconductor material chip and is carried in a housing 5 of a ceramic body 6. A glass layer 8, which closes the housing 5 at the top and is arranged at a distance from the sensor 2, seals the sensor 2 without altering the optical properties of light beams directed towards the sensor 2.

The supporting element 3, of plastic material, is rigidly coupled with the sensor 2 and the ceramic body 6; for example, it is bonded on the glass layer 8, and has inside it a threaded seat 9.

The objective 4 comprises a barrel 10 and an optical unit 11, interference-fitted together.

In particular, the optical unit 11, formed of one or more lenses, not illustrated herein in detail, has a cylindrical shape and an optical axis A, which is also a longitudinal axis of symmetry. The optical unit 11 is forced inside a cavity 13 of the barrel 10 and is coaxial with the barrel 10. In addition, the barrel 10 has a bottom wall 14 that delimits the cavity 13 and has a through opening 15 enabling passage of light towards the sensor 2, and an externally threaded side wall 17, which can be connected to the threaded seat 9 of the supporting element 3 so as to form a threaded connection, which has a dual function. First, this connection enables precise adjustment of the axial position between the optical unit 11 and the sensor 2, which are rigidly coupled, respectively, with the barrel 10 and with the supporting element 3. In this way, it is possible to focus the objective 4 on the sensor 2. In addition, the connection between the supporting element 3 and the barrel 10 has the function of keeping the optical unit 11 properly aligned. In particular, in ideal conditions, the optical axis A must be exactly orthogonal to the plane defined by the upper surface 2a of the sensor 2.

The accuracy of the image-detecting device 1 is markedly influenced not only by correct focusing, but also by the precision with which the optical axis A of the optical unit 11 is centered and aligned with respect to the sensor 2. Centering, alignment and focusing are carried out in the factory. Operatively, the optical axis A is centered by translating the supporting element 3 parallel to the upper plane surface 2a of the sensor 2, after the supporting element 3 and the objective 4 have been pre-assembled and before the supporting element 3 is bonded on the glass layer 8. After bonding, the threaded connection between the supporting element 3 and the barrel 10 is exploited to carry out focusing. As mentioned above, in this step the barrel 10 is rotated so as to adjust appropriately the axial position of the optical unit 11 with respect to the sensor 2.

In practice, however, the threaded connection between the supporting element 3 and the barrel 10 inevitably has some play causing the alignment of the optical axis A of the optical unit 11 to be imprecise with respect to the axis of symmetry (not shown) of the support 3. As illustrated schematically and in an exaggerated way in FIGS. 2a, 2b, in fact, the misalignment of the optical axis A with respect to the axis of the support 3 and hence the lack of orthogonality of the optical axis A with respect to the surface 2a may cause, during the rotation of the objective 4, a precession movement of the optical axis A. In addition, also centering is impaired. Very frequently, the deviation of the optical axis A from the correct position can be considerable, and hence the image detected by the sensor 2 is distorted and of unacceptable quality.

The above drawback is particularly serious, in so far as it can be detected only during focusing and hence after bonding the supporting element 3. Consequently, a alignment defect in the optical axis A renders the entire device 1 unusable, and not only the objective 4, thus leading to significant repercussions on the yield of the production process.

BRIEF SUMMARY OF THE INVENTION

An embodiment of the present invention include an optical device including a body; a first supporting element, rigidly coupled with said body and defining a seat; and an objective including at least one optical unit having an optical axis. In accordance with another embodiment of the invention, the seat is configured to form a guide portion to slidably engage an alignment portion of said optical unit.

BRIEF DESCRIPTION OF THE SEVERAL VIEWS OF THE DRAWING(S)

For a better understanding of the invention, two embodiments thereof are now described, purely by way of non-limiting example, with reference to the attached drawings, wherein.

DETAILED DESCRIPTION OF THE INVENTION

Embodiments of the present invention provide an optical device devoid of the drawbacks described previously and that, in particular, will enable an optimal alignment between the optical axis of the optical unit and the sensor. According to embodiments of the present invention, an optical device is provided.

Figure 1:
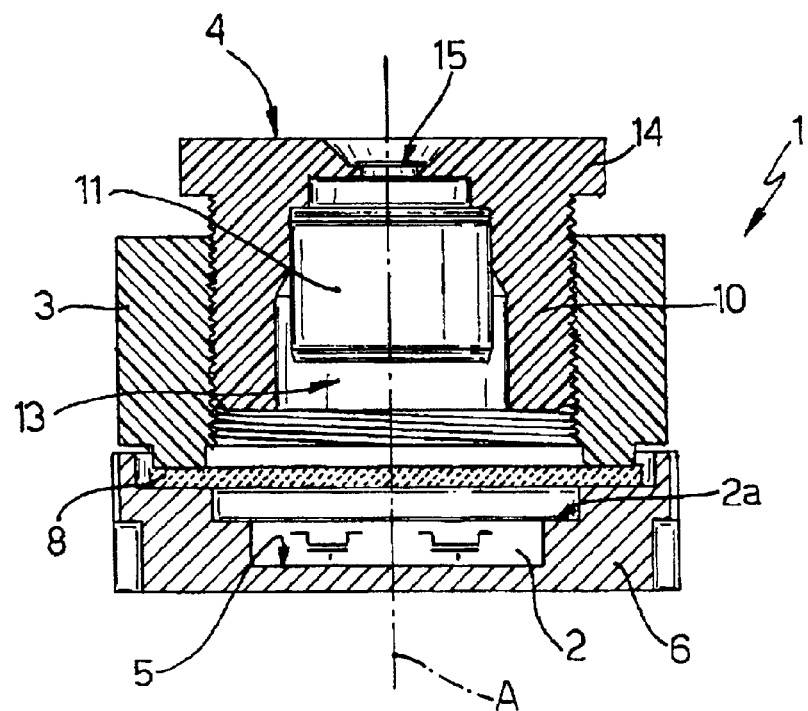
FIG. 1 is a longitudinal section of an image-detecting device of a known type.
Figure 2A:
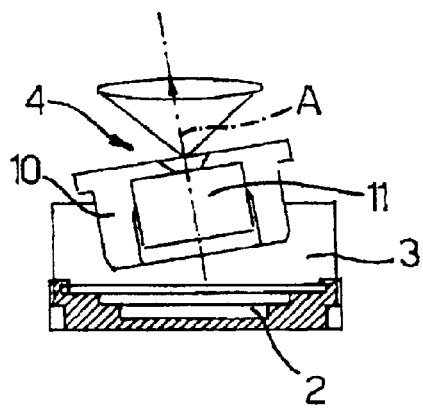
FIGS. 2a and 2b are schematic representations of the device of FIG. 1 in two different positions, during a focusing step.
Figure 2B:
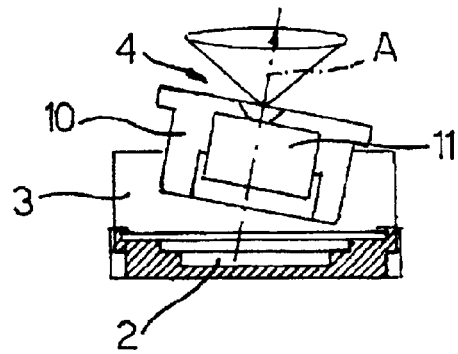
Figure 3:
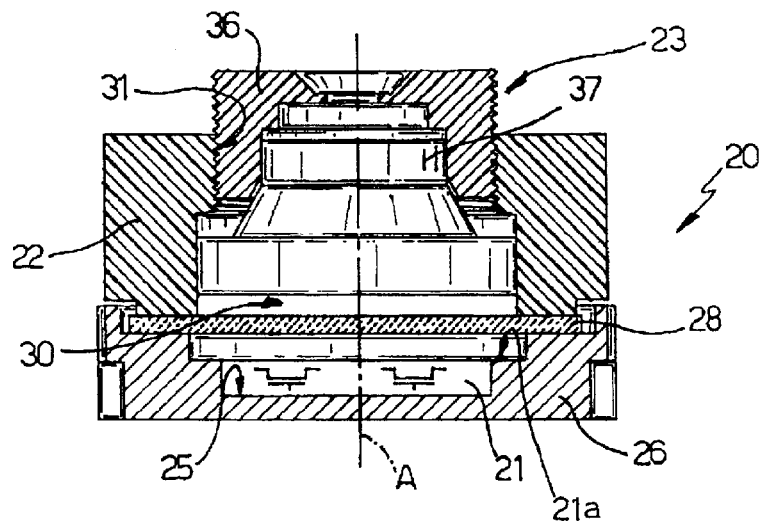
FIG. 3 is a longitudinal section of an image-detecting device according to a first embodiment of the present invention.
Figure 4:
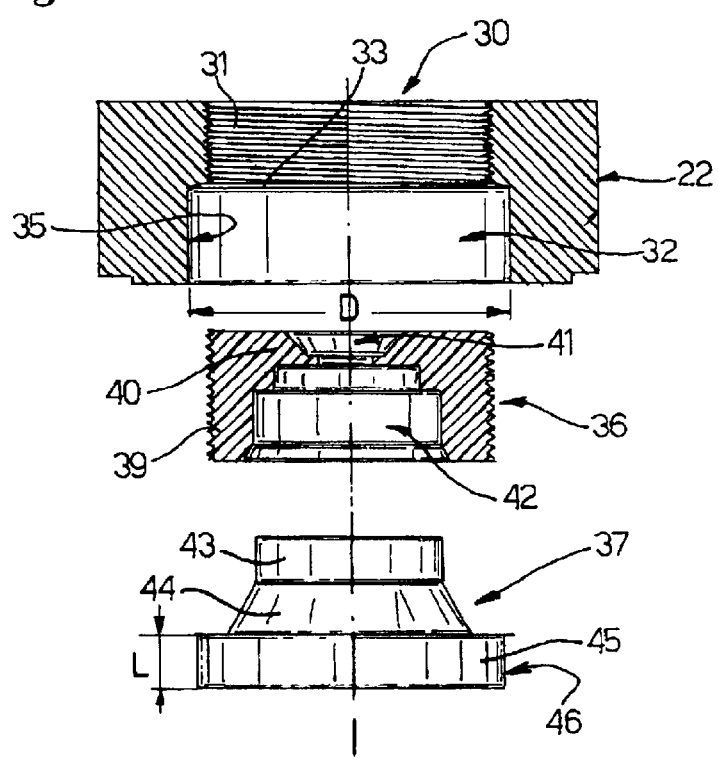
FIG. 4 is a longitudinal section of one part of the device of FIG. 3, in exploded view.

With reference to FIGS. 3 and 4, an image-detecting device 20 comprises a sensor 21, a supporting element 22, and an objective 23.

The sensor 21, for example a matrix CMOS sensor of a per se known type, is formed by a semiconductor material chip having an upper surface 21a, and is carried in a housing 25 of a ceramic body 26. A glass layer 28, which closes the housing 25 at the top and is distant from the sensor 21, seals the sensor 21 without altering the optical properties of light beams directed toward the sensor 21.

The supporting element 22, preferably made of plastic material, is rigidly coupled with the ceramic body 26, for example being bonded on the glass layer 28, and has, inside it, a through seat 30, which, in use, receives the objective 23. In detail, the through seat 30 comprises a threaded portion 31 and a guide portion 32, both cylindrical and connected together through a tapered connecting portion 33 (FIG. 4). The guide portion 32 has a diameter D that is greater than the diameter of the threaded portion 31, and has a sliding surface 35; in addition, the supporting element 22 is oriented in such a way that the guide portion 32 faces the ceramic body 26 and the sensor 21.

The objective 23 comprises a barrel 36 and an optical unit 37, which are interference-fitted together and coaxial.

The barrel 36 is cylindrical, has an externally threaded side wall 39, that may be coupled with the threaded portion 31 of the supporting element 22, and a bottom wall 40 provided with a through opening 41. In addition, the barrel 36 has inside a cup-shaped seat 42 to be coupled with the optical unit 37, as explained hereinafter.

The optical unit 37, which can comprise a lens or a set of lenses, as shown hereinafter, has an optical axis A, which is also a longitudinal axis of symmetry, and comprises a coupling portion 43, a connection portion 44 and an alignment portion 45.

The coupling portion 43 is forced inside the seat 42 of the barrel 36, which is therefore angularly and axially coupled with the optical unit 37. The connection portion 44 and the alignment portion 45 of the optical unit 37 protrude, instead, with respect to the barrel 36, on the opposite side to the bottom wall 40.

According to exemplary embodiments of the invention, the alignment portion 45, which has a cylindrical shape with a symmetry axis formed by the optical axis A, is radially calibrated with respect to the sliding surface 35 of the guide portion 32 of the supporting element 22. In other words, the alignment portion 45 has a diameter that is roughly equal to the diameter D of the guide portion 32, and one 46 of its external surfaces is countershaped to the sliding surface 35. The alignment portion 45 can thus be slidably inserted in the guide portion 32 with very slight friction and basically without any play.

Preferably, the L/D ratio between an axial dimension L of the alignment portion 45 and its diameter (equal to the diameter D of the guide portion 32) is not less than 1:3.

The objective 23 is at least partially housed in the through seat 30 of the supporting element 22. In detail, the external wall 39 of the barrel 36 is inserted in the threaded portion 31, so as to form a threaded connection which functions as an adjustment mechanism for adjusting the axial position between the objective 23 and the supporting element 22 and thus carrying out focusing.

The alignment portion 45 of the optical unit 37 is instead arranged inside the guide portion 32 and defines, with the sliding surface 35, a radially calibrated sliding connection. In practice, this connection enables optimal alignment of the supporting element 22 and the optical unit 37, which are kept coaxial irrespective of any possible play or imperfections in the fit with the barrel 36. Since the positioning of the supporting element 22 with respect to the sensor 21 and the subsequent bonding can be performed with very high precision, the optical unit 37 is, in use, arranged so that the optical axis A is orthogonal to the surface 21a of the sensor 21 within amply acceptable margins. Furthermore, also during focusing, when the threaded connection between the barrel 36 and the supporting element 22 is adjusted, the sliding connection between the supporting element 22 and the optical unit 37 prevents rotations (in particular movements of precession) of the optical axis A, which hence remains properly aligned.

Figure 5:
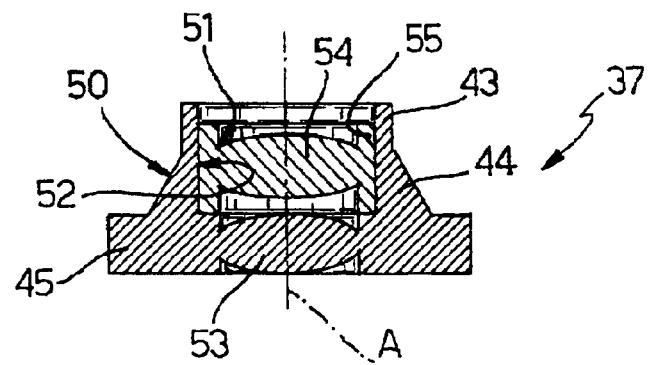
FIG. 5 is a longitudinal section of a detail of the device of FIGS. 3 and 4.

FIG. 5 illustrates in greater detail the structure of the optical unit 37, which in this case comprises a set of lenses.

In particular, the optical unit 37 comprises a supporting body 50 and an optical element 51, both of a material pervious to light. The supporting body 50 is externally shaped so as to form the coupling portion 43, the connection portion 44 and the alignment portion 45 described previously, and has a cavity 52 in which the optical element 51 is forced. The cavity 52 extends along the coupling portion 43 and the connection portion 44, and is axially delimited by a bottom portion of the supporting body 50 forming a first lens 53, here a biconvex lens.

The optical element 51 comprises a second lens 54 and a contrast ring 55 which surrounds the second lens 54 and can be interference-fitted to the cavity 52. In the present embodiment, also the second lens 54 is biconvex.

In addition, the first lens 53 and the second lens 54 are mutually aligned and define the optical axis A of the optical unit 37.

Exemplary embodiments of the invention have the following advantages.

First, it is possible to align the optical axis A of the optical unit 37 with respect to the sensor 21 with a high precision, substantially eliminating the consequences of play and any imperfections in the connection of the barrel 36 to the supporting element 22 (threaded connection) and to the optical unit 37 (interference fit). In addition, the alignment of the optical axis A is maintained also during focusing of the objective 23 on the sensor 21. On the other hand, since the optical unit 37 is aligned directly to the supporting element 22 and to this aim no intermediate connections are required, the fabrication of the individual parts entails a lower degree of precision and is thus in itself less costly. Consequently, the image-detecting device 20 is, as a whole, more accurate than known sensor assemblies and, at the same time, the risk of producing faulty pieces is considerably reduced.

In addition, the device according to embodiments of the invention has small overall dimensions and is particularly suitable for integration in devices, such as cellphones, for which the overall dimensions and the weight are determining factors.

Figure 6:
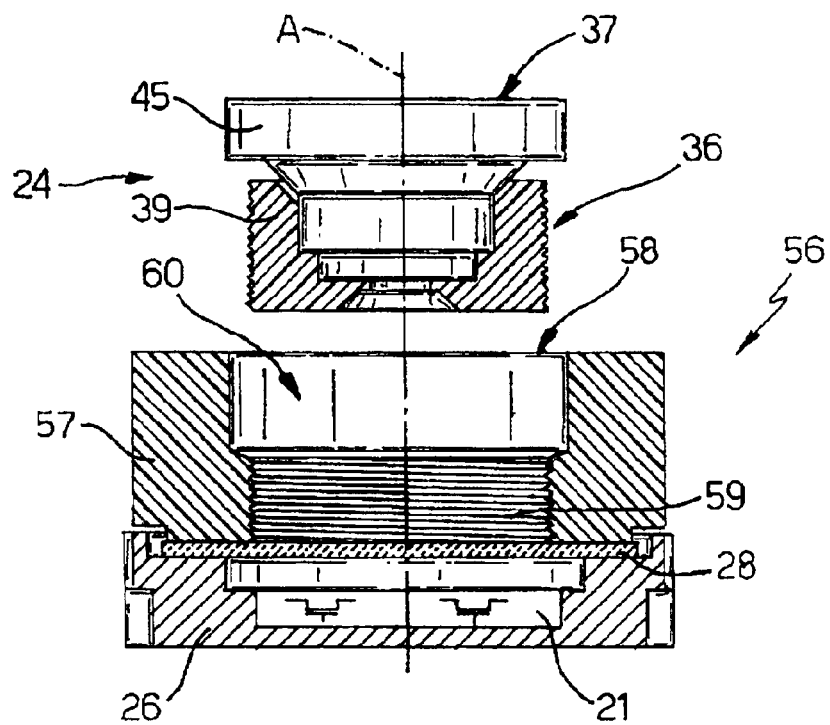
FIG. 6 is a longitudinal section, partially exploded, of an image-detecting device according to a different embodiment of the present invention.

According to a different embodiment of the invention, illustrated in FIG. 6, in which parts equal to those already shown are designated with the same reference numbers, an image-detecting device 56 comprises the sensor 21 (carried in the housing 25 of the ceramic body 26 and sealed by the glass layer 28), the objective 23, including the barrel 36 and the optical unit 37, and a supporting element 57.

The supporting element 57 has inside a through seat 58, comprising a threaded portion 59 and a guide portion 60. The through seat 58 receives the objective 23, as already explained with reference to FIGS. 3 and 4. In particular, the threaded portion 59 is connected to the side wall 39 of the barrel 36, while the guide portion 60 forms a radially calibrated sliding connection with the alignment portion 45 of the optical unit 37.

Here, the supporting element 57 is bonded to the glass layer 28 so that the threaded portion 59 and the barrel 36 are close to the sensor 21. The guide portion 60 is thus accessible from outside, and the objective 23 can be removed from the through seat 58 and disconnected from the supporting element 57.

Clearly, this represents an advantage of the image-detecting device 56, in so far as it is easy to carry out maintenance interventions, such as cleaning or replacement of the optical unit 37 in the event of breakage.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

Finally, it is evident that numerous modifications and variations may be made to the detecting device described herein, without thereby departing from the scope of the present invention. Accordingly, the invention is not limited except as by the appended claims.

For example, the optical unit 37 may be different from the one shown. In particular, the shape of the coupling portion may vary; for instance, it could be prismatic. Likewise, the shape of the connection portion may be different. In addition, the optical unit may comprise lenses different in number and in type with respect to what is illustrated herein. The supporting element and the barrel could moreover be made of metal material.

What is claimed is:

1. An optical device comprising:
    a body;
    a first supporting element, rigidly coupled with said body and defining a seat;
    a second supporting element threadedly coupled to said seat;
    an objective including an optical unit having an optical axis, said seat configured to form a guide portion to slidably engage an alignment portion of said optical unit,
    said second supporting element having a cavity and said optical unit has a coupling portion interference-fitted in said cavity.

2. The device according to claim 1 wherein said alignment portion is calibrated with respect to a sliding surface of said guide portion.

3. The device according to claim 2 wherein said alignment portion and said sliding surface have a cylindrical shape.

4. The device according to claim 3 wherein said alignment portion of said optical unit has an axial dimension and a diameter and in that the ratio between said axial dimension and said diameter is not less than 1:3.

5. The device according to claim 1, further focusing means arranged between said first supporting element and second supporting element.

6. The device according to claim 5 wherein said focusing means comprise screw connection means, including a threaded portion formed by said seat and an externally threaded side wall formed by said second supporting element, angularly and axially coupled with said optical unit.

7. An optical device comprising:
    a body;
    a first supporting element rigidly coupled with said body and defining a seat;
    a second supporting element threadedly coupled to said seat;
    an objective including an optical unit having an optical axis, said seat configured to form a guide portion to slidably engage an alignment portion of said optical unit;
    focusing means arranged between said first supporting element and second supporting element, said focusing means having screw connection means, including a threaded portion formed by said seat and an externally threaded side wall formed by said second supporting element, angularly and axially coupled with said optical unit;
    said second supporting element having a cavity and said optical unit having a coupling portion interference-fitted in said cavity.

8. The device according to claim 7 wherein said guide portion is arranged between said body and said threaded portion.

9. The device according to claim 7 wherein said threaded portion is arranged between said body and said guide portion.

10. The device according to claim 1 wherein said body houses a sensor.

11. An image detecting device comprising:
    a sensor;
    a housing coupled to the sensor;
    a support including an internal threaded portion and an internal guide portion having a sliding surface, the support rigidly linked with the housing; and
    an objective including:
        a barrel with an external threaded side wall and a seat, the external threaded side wall of the barrel threadably engaged with the internal threaded portion of the support; and
        an optical unit including a coupling portion and an alignment portion with an external surface, the coupling portion of the optical unit coupled with the seat of the barrel, the external surface of the alignment portion of the optical unit slidably engaged with the sliding surface of the internal guide portion of the support.

12. The device according to claim 11 wherein said alignment portion of the optical unit is radially calibrated with respect to the sliding surface of the internal guide portion of the support such that the slideable engagement between the alignment portion of the optical unit and the sliding surface of the internal guide portion of the support is substantially playless.

13. The device according to claim 11 wherein the alignment portion of the optical unit has an axial dimension and a diameter wherein, the ratio between the axial dimension and the diameter is not less than 1:3.

14. The device according to claim 11, further including a glass layer rigidly linked to and positioned between the housing and the support.

15. The device according to claim 11 wherein the sensor is of a matrix CMOS type.

16. The device according to claim 11 wherein the seat is cup shaped.

17. The device according to claim 11 wherein the optical unit includes at least one lens.

18. The device according to claim 11 wherein the alignment portion of the optical unit protrudes with respect to the barrel of the objective.

19. An optical device comprising:
a first supporting element having a through-opening defined by a guide portion and a coupling portion; and
an objective including an optical unit having an optical axis, the objective including an alignment portion and a coupling portion, the alignment portion being configured to slidably engage the guide portion of the first supporting element unit and the coupling portion of the objective being configured to engage the coupling portion of the first supporting element to adjustably connect the objective to the first supporting element.

20. The device of claim 19 wherein the alignment portion includes a peripheral engagement surface and has a central axis that is coaxial with the optical axis of the optical unit, and wherein the guide portion has an internal surface that defines a portion of the through-opening and slidably contacts the peripheral engagement surface.

21. The device, of claim 19 wherein the alignment portion of the objective has an axial dimension and a diameter and the ratio between the axial dimension and the diameter is not less than 1:3.

22. The device of claim 19 wherein the coupling portion of the objective includes an externally-threaded portion and the coupling portion of the first supporting element has an internally-threaded portion that mates with the externally-threaded portion.

23. The device of claim 19 wherein the objective includes a second supporting element that includes the coupling portion of the objective and defines an internal cavity and the optical unit has a coupling portion interference-fitted in the cavity.

24. The device of claim 19, further comprising a sensor unit connected to the first supporting element and aligned with the optical axis of the optical unit.

25. The device of claim 24 wherein the alignment portion is arranged between the sensor unit and the coupling portion of the objective.

26. The device according to claim 24 wherein the coupling portion of the objective is arranged between the sensor unit and the alignment portion.

27. The device according to claim 19 wherein said alignment portion of the objective is radially calibrated with respect to an internal sliding surface of the guide portion of the first supporting element to provide a substantially playless, slidable engagement between the alignment portion of the optical unit and the sliding surface.

* * * * *

UNITED STATES PATENT AND TRADEMARK OFFICE
CERTIFICATE OF CORRECTION

PATENT NO. : 6,842,300 B2
DATED : January 11, 2005
INVENTOR(S) : Pierangelo Magni et al.

It is certified that error appears in the above-identified patent and that said Letters Patent is hereby corrected as shown below:

<u>Column 5,</u>
Line 62, "The device according to claim 1, further focusing means" should read
-- The device according to claim 1, further comprising focusing means --.

Signed and Sealed this

Thirtieth Day of August, 2005

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,842,300 B2 |
| APPLICATION NO. | : 10/171453 |
| DATED | : January 11, 2005 |
| INVENTOR(S) | : Pierangelo Magni et al. |

Page 1 of 1

It is certified that error appears in the above-identified patent and that said Letters Patent is hereby corrected as shown below:

Title Page
Item (73), Assignee information, should read as -- STMicroelectronics S.r.I., Agrate Brianza (IT); STMicroelectronics Limited, Bristol (GB) --.

Signed and Sealed this

Fourth Day of March, 2008

JON W. DUDAS
*Director of the United States Patent and Trademark Office*